United States Patent [19]

Dueber et al.

[11] Patent Number: 5,728,505

[45] Date of Patent: Mar. 17, 1998

[54] FLEXIBLE, AQUEOUS PROCESSABLE, PHOTOIMAGEABLE PERMANENT COATINGS FOR PRINTED CIRCUITS

[75] Inventors: Thomas Eugene Dueber; Frank Leonard Schadt, III, both of Wilmington, Del.

[73] Assignee: E. I. du Pont de Nemours and Company, Wilmington, Del.

[21] Appl. No.: 802,494

[22] Filed: Feb. 20, 1997

Related U.S. Application Data

[63] Continuation of Ser. No. 431,214, Apr. 28, 1995, abandoned.

[51] Int. Cl.$^6$ .................................. G03F 7/033; G03F 7/09
[52] U.S. Cl. ............................ 430/271.1; 430/284.1; 430/906; 430/910; 522/116; 522/117
[58] Field of Search ..................... 430/284.1, 271.1; 522/116, 117

[56] References Cited

U.S. PATENT DOCUMENTS

| | | | |
|---|---|---|---|
| 3,469,982 | 9/1969 | Roland et al. | 96/35.1 |
| 3,547,730 | 12/1970 | Cohen et al. | 156/345 |
| 4,247,621 | 1/1981 | Sano et al. | 430/269 |
| 4,349,620 | 9/1982 | Cyr et al. | 430/259 |
| 4,427,760 | 1/1984 | Nagazawa et al. | 430/910 X |
| 4,438,189 | 3/1984 | Geissler et al. | 430/280 |
| 4,937,172 | 6/1990 | Gervay | 430/280 |
| 4,987,054 | 1/1991 | Sondergeld et al. | 430/275.1 |
| 5,153,101 | 10/1992 | Meier et al. | 430/910 X |
| 5,286,611 | 2/1994 | Meier et al. | 430/325 |
| 5,288,589 | 2/1994 | McKeever et al. | 430/262 |

FOREIGN PATENT DOCUMENTS

| | | |
|---|---|---|
| 0115354 | 8/1984 | European Pat. Off. . |
| 0430175 | 6/1991 | European Pat. Off. . |
| 0501834 A1 | 9/1992 | European Pat. Off. . |
| 93/17368 | 9/1993 | WIPO . |

OTHER PUBLICATIONS

Encyclopedia of Polymer Science and Engineering, vol. 10, John Wiley & Sons New York, NY, 1988, pp. 1–19.

*Primary Examiner*—Cynthia Hamilton

[57] ABSTRACT

Aqueous processable, photopolymerized coating compositions are disclosed, which after curing, have superior flexibility for use as permanent coatings for the protection of printed circuitry.

30 Claims, No Drawings

FLEXIBLE, AQUEOUS PROCESSABLE, PHOTOIMAGEABLE PERMANENT COATINGS FOR PRINTED CIRCUITS

This is a continuation of application Ser. No. 08/431,214 filed Apr. 28, 1995, now abandoned.

BACKGROUND OF THE INVENTION

The present invention is directed to aqueous processable, photopolymerizable compositions having superior flexibility while preserving important properties for their use as permanent coatings for the protection of printed circuitry.

Photopolymerizable resist materials are known, for example, from U.S. Pat. Nos. 3,469,982 and 3,547,730, which describe a film resist with a sandwich structure in the form of a photopolymerizable layer between a cover sheet and a temporary support. This film resist can, for instance, be laminated on a copper base, exposed imagewise and developed with organic solvents or aqueous solutions, whereby a defined resist layer is formed. Typically the copper base for a printed circuit board is rigid, with limited flexibility of just a few degrees, such as the conventional copper-clad fiberglass epoxy laminates. More recently, printed circuits are being prepared on highly flexible film substrates to form electronic packages which may be folded and refolded one or more times to fit a specified configuration or a dynamic mechanical operation.

The defined resist layer thus produced can now be selectively etched, electroplated or treated with solder on the substrate. Particularly high demands are placed on photoresist films if they are used as permanent coatings that function as solder resists or masks. In this case, the developed, photopolymerized layer must withstand temperatures up to 300° C. without degradation, loss of adhesion or accumulation of residues contained in or on the molten solder. With the advanced technology of today's printed circuit boards, it is important to have the capability to photoimage a solder mask. According to the current state of the art, such solder masks can be made by spraying, coating or calendaring liquid compositions on a substrate or also by laminating a dry film on a substrate.

Due to the adverse environmental impact of solvents, aqueous developable photopolymer systems with fast development are now preferred. The use of photopolymer resists with acid functions, primarily carboxyl functions, is known to impart aqueous processability. However, these groups are disadvantageous in many subsequent steps or events. In the case of photoresists, delamination of the resist is observed in alkali etching or gold plating and, in the case of solder masks, inadequate environmental resistance can occur. Modification of the carboxyl groups with melamine formaldehyde compounds to overcome the named disadvantages is known (EP 01 15 354 and U.S. Pat. No. 4,247,621).

The utilization of polymers containing carboxylic acid groups that are subsequently converted to less reactive and less moisture sensitive species is also known. U.S. Pat. No. 4,987,054 discloses a photo-polymerizable formulation yielding improved properties containing an acid copolymeric binder wherein a copolymer structural unit is the half acid/amide of a dicarboxylic acid. The disclosed formulations are used with conventional rigid printed circuit boards, processed with wholly aqueous alkaline solutions and are storage stable. European Patent Application EP 430,175 discloses a photopolymeric system similar to U.S. Pat. No. 4,987,054.

International Patent Application WO 93/17368 discloses an aqueous processable, photoimageable, permanent coating for printed circuits comprising (a) a cobinder consisting of a low molecular weight amic acid copolymer and a high molecular weight carboxylic acid-containing copolymer, (b) an acrylated urethane monomer component, (c) a photoinitiator system, and (d) a thermal crosslinking agent. The coating compositions of the present invention, however, do not contain an amic acid copolymer binder component and have reduced tack when compared to the coatings disclosed in WO 93/17368.

As the electronic industry is driven towards faster, more reliable and compact devices, there is an increasing need in the printed circuit field for a more flexible, permanent coating that can withstand typical manufacturing process conditions, such as molten solder, and continuously varying environmental conditions while maintaining its integrity. The capability of such a coating to stand up to varied conditions and, in addition, be photoimageable and aqueous processable would constitute an advancement of the art. Current protective coatings for polyimide flexible circuitry require mechanical punching or drilling before lamination in an overall costly, low productivity process. Particularly preferred is a photoimageable, aqueous processable, permanent coating for use with flexible circuitry that can be made with conventional, lower cost photoforming manufacturing processes that have higher resolution capability, and wherein the flexible circuits can be subjected to flexural stress and yet maintain functionality.

SUMMARY OF THE INVENTION

The present invention relates to a flexible, aqueous processable, photopolymerizable, permanent coating composition, which comprises:

(a) a cobinder system comprising at least one low molecular weight copolymer binder component having a molecular weight of from 3,000 to 15,000 and containing from 2 to 50% by weight of at least one carboxylic acid containing structural unit and from 50 to 98% by weight of at least one structural unit of the formula

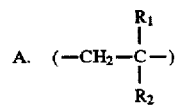

wherein $R_1$ is H, alkyl, phenyl or aryl; $R_2$ is H, $CH_3$, phenyl, aryl, $-COOR_3$, $-CONR_4R_5$ or $-CN$; and $R_3$, $R_4$ and $R_5$ independently are H, alkyl or aryl, which is unsubstituted or substituted with one or more hydroxy, ester, keto, ether or thioether groups; and at least one high molecular weight carboxylic acid containing copolymer binder component having a molecular weight of from 40,000 to 500,000 and containing structural units of the formula

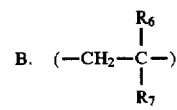

wherein $R_6$ is H, alkyl, $-CN$, phenyl, alkylphenyl or aryl; $R_7$ is phenyl, alkylphenyl, aryl, $-COOR_8$ or $-CONR_4R_5$; $R_8$ is H or alkyl; and wherein alkyl contains from 1 to 8 carbon atoms;

(b) an acrylated urethane monomeric component;

(c) a photoinitiator or a photoinitiator system; and (d) a blocked polyisocyanate crosslinking agent.

DETAILED DESCRIPTION OF THE INVENTION

The present invention relates to an aqueous processable, permanent, photopolymerizable composition for use as a flexible protective coating for printed circuitry comprising as essential ingredients (a) a cobinder system, (b) an acrylated urethane monomeric component, (c) a photoinitiator or a photoinitiator system and (d) a blocked polyisocyanate cross-linking agent as specifically described hereinafter.

(a) Cobinder System

The cobinder system essential to the invention contains a low molecular weight copolymer binder component containing from 2 to 50% by weight of at least one carboxylic acid-containing structural unit, and from 50 to 98% by weight of at least one structural unit A of the formula:

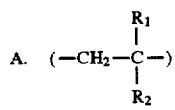

wherein $R_1$ is H, alkyl, phenyl or aryl, preferably H or $CH_3$; $R_2$ is H, $CH_3$, phenyl, aryl, —$COOR_3$, —$CONR_4R_5$ or —CN, preferably phenyl, —$COOR_3$ or —$CONR_4R_5$; and $R_3$, $R_4$ and $R_5$ independently are H, alkyl or aryl, which is unsubstituted or substituted with one or more hydroxy, ester, keto, ether or thioether groups, preferably unsubstituted or hydroxy substituted alkyl or aryl groups.

The carboxylic acid-containing structural unit of the acid-containing low molecular weight copolymer binder component can be formed from any ethylenically unsaturated carboxylic acid, or carboxylic acid precursor comonomer that subsequently can be reacted to form the acid, and which will polymerize to form the desired low molecular weight copolymer. Examples of suitable ethylenically unsaturated carboxylic acid or carboxylic acid precursor comonomers include acrylic and methacylic acids; maleic acid; maleic acid half ester or anhydride; itaconic acid; itaconic acid half ester or anhydride; citraconic acid; citraconic acid half ester or anhydride; and substituted analogues thereof.

Particularly preferred ethylenically unsaturated carboxylic acids are acrylic acid and methacrylic acid. The proportion of carboxylic acid-containing structural unit in the low molecular weight copolymer binder ranges from 2 to 50% by weight, and preferably from 5 to 25% by weight.

The molecular weight of the carboxylic acid-containing low molecular weight copolymer binder is in the range of 3,000 to 15,000, as measured by Gel Permeation Chromatography (GPC), preferably from 4,000 to 10,000.

Suitable comonomers, which form the structural unit A of the carboxylic acid containing low molecular weight copolymer binder include styrene, substituted styrenes, and unsaturated carboxylic acid derivatives, such as, for example, esters and amides of acrylic and methacrylic acids. Methyl methacrylate, ethyl methacrylate, butyl methacrylate, methacrylamide, methyl acrylate, ethyl acrylate, butyl acrylate, acrylamide, hydroxyethyl acrylate, hydroxyethyl methacrylate and styrene are preferred.

When the permanent coating is photoprinted, development of the composition requires that the low molecular weight carboxylic acid-containing copolymer binder component contains sufficient acidic or other groups to render the composition processable in aqueous alkaline developer. The coating layer formed from the composition is removed in portions which are not exposed to radiation but is substantially unaffected in exposed portions during development by aqueous alkaline liquids such as wholly aqueous solutions containing 1% sodium or potassium carbonate by weight for a time period of five minutes at a temperature of 40° C.

The permanent coating composition of the invention additionally contains at least one high molecular weight carboxylic acid-containing copolymer binder component to modify coated film integrity, adhesion, hardness, oxygen permeability, moisture sensitivity, and other mechanical or chemical properties required during its processing or end use. Suitable high molecular weight copolymer cobinders, which are used in combination with the low molecular weight carboxylic acid containing copolymer binder component, include monomers which form structural units B:

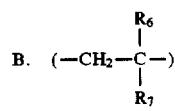

wherein $R_6$ is H, alkyl, —CN, phenyl, alkylphenyl or aryl; $R_7$ is phenyl, alkylphenyl, aryl, —$COOR_8$ or —$CONR_4R_5$; $R_8$ is H or alkyl; $R_4$ and $R_5$ independently are H, alkyl, or aryl which is unsubstituted or substituted with one or more hydroxy, ester, keto, ether, or thioether groups, preferably unsubstituted or hydroxy substituted alkyl or aryl groups.

The carboxylic acid-containing structural unit of the acid-containing high molecular weight copolymer binder component can be formed from any ethylenically unsaturated carboxylic acid, or carboxylic acid precursor comonomer that subsequently can be reacted to form the acid, and which will polymerize to form the desired high molecular weight copolymer. Examples of suitable ethylenically unsaturated carboxylic acid or carboxylic acid precursor comonomers include acrylic and methacrylic acids; maleic acid; maleic acid half ester or anhydride; itaconic acid; iraconic acid half ester or anhydride; citraconic acid; citraconic acid half ester or anhydride; and substituted analogues thereof.

Preferred comonomers for use in forming the high molecular weight copolymer binder are styrene, methacrylic acid, methyl methacrylate, ethyl methacrylate, butyl methacrylate, acrylic acid, methyl acrylate, ethyl acrylate, octylacrylamide, hydroxypropyl methacrylate, t-butylaminoethyl methacrylate, hydroxyethyl acrylate, hydroxyethyl methacrylate and butyl acrylate. Methacrylic and acrylic acids are especially preferred comonomers in the cobinder for aqueous alkaline development. Other suitable high molecular weight carboxylic acid-containing copolymer binders are those comprising styrene and maleic anhydride/acid/half ester/ester, and substituted analogues thereof.

The proportion of the low molecular weight acid-containing copolymer binder component ranges from 2 to 50 weight %, and the proportion of the high molecular weight carboxylic acid copolymer binder component ranges from 50 to 98 weight %, based on the total weight of the cobinder system.

The cobinder system of the present invention, comprising low and high molecular weight carboxylic acid-containing copolymer binder components, is critical to obtaining desired properties of the coating composition. The low molecular weight carboxylic acid-containing binder component helps achieve end-use properties, such as encapsulation of circuit patterns without air entrapment, fast development in aqueous carbonate developer, flexibility, adhesion, resistance to environmental conditions, and resistance to alkali etching or plating solutions. The high molecular weight copolymer binder component is required for film integrity and flexibility of the cured film.

The present invention does not require the use of polymers containing carboxylic acid groups that are subsequently converted by reactions within the polymer to less reactive and less moisture sensitive species on curing, such as an amic acid copolymer binder containing the half acid/amide of a dicarboxylic acid. Moreover, the invention does not require the use of such an amic acid polymer to obtain adequate adhesion to flexible circuitry, such as to copper, laminate adhesive or polyimide laminate materials. Furthermore, the cobinder system of the present invention does not contain amic acid functionality and avoids a complicating side reaction with the blocked isocyanate used as crosslinking agent, and tends to produce less residue using aqueous developers. In addition, the low molecular weight copolymers of the invention, compared to low molecular weight amic acid polymers, reduce the amount of volatiles that are liberated at curing and soldering temperatures.

The use of a low molecular weight copolymer, preferably 5 weight % of the total binder composition, aids in improving encapsulation during lamination, in reducing the development time required and improving adhesion. The low molecular weight copolymer component acts to plasticize the high molecular weight copolymer component. This provides better flow during vacuum lamination and allows encapsulation of circuit patterns without air entrapment. The plasticizing effect also allows the coating composition to develop in a shorter time than is required if the low molecular weight copolymer is not present. Adhesion is improved with the addition of the low molecular weight copolymer and results in better lamination to the substrate. In addition, there is a reduction in the amount of volatiles that are liberated during curing and during high temperature solder exposure when the low molecular weight amic acids are replaced with the low molecular weight carboxylic acid copolymers of the present invention.

A preferred cobinder system of the invention comprises an admixture of from 2 to 50% by weight, most preferably from 4 to 45% by weight, of an acid-containing low molecular weight copolymer component having a molecular weight ranging from 3,000 to 15,000, most preferably from 4,000 to 10,000, an acid number of from 5 to 400, most preferably from 30 to 200 and a Tg of less than 50° and preferably less than 25° C. and from 50 to 98% by weight, preferably from 55 to 96% by weight of an acid-containing high molecular weight copolymer component having a molecular weight ranging from 40,000 to 500,000, most preferably from 100,000 to 250,000, an acid number of from 35 to 400, preferably from 50 to 200, and a Tg of 25° to 100° C. preferably from 30° to 55° C. The optimum ratio of low molecular weight copolymer to high molecular weight copolymer ranges from 0.05 to 0.55, preferably from 0.1 to 0.3.

A particularly preferred cobinder system of the present invention comprises an admixture of 11.8% by weight of an acid-containing low molecular weight copolymer component having a monomer composition of 92/8 (by weight) ethyl acrylate/acrylic acid, a molecular weight of 7,000, an acid number of 63, and a Tg of −14° C. and 88.2% by weight of an acid-containing high molecular weight copolymer component having a monomer composition of 32/58/10 (by weight) methyl methacrylate/ethyl acrylate/acrylic acid, a molecular weight of 200,000, an acid number of 80, and a Tg of 37° C.

(b) Acrylated Urethane Monomeric Component

An acrylated urethane is an essential component of the photopolymerizable composition, since it imparts increased flexibility to the cured layer and reduced brittleness, when used in the correct proportion with the other essential ingredients of the invention. It is known that many factors influence the properties (e.g. glass transition temperature) and thus performance of urethane structures in a particular application. These factors include diisocyanate type, diol type (i.e. polyester, polyesteramide, polyether), diol molecular weight, codiols (i.e. short chain diols), ratio of diol to codiol, as well as the amount of branching and molecular weight of the resultant polyurethane. Properties after acrylation will vary correspondingly. It is important to choose the proper acrylated urethane and amount of such relative to the other essential ingredients in order to obtain a proper balance of flexibility, toughness and chemical resistance in the permanent coating. The acrylated urethane is present in an amount of from 5 to 30 parts by weight and contains at least one acrylate or methacrylate group.

Preferred types of acrylated urethanes have the general formula:

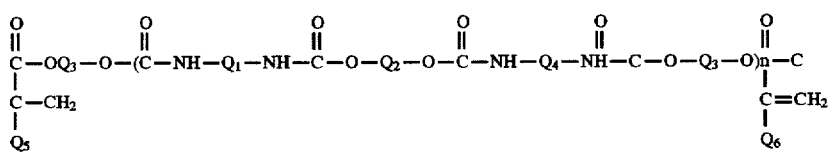

wherein $Q_1$ and $Q_4$ are aromatic groups which may be unsubstituted or substituted by lower alkyl groups and which can contain a lower alkylene group as a connecting member; $Q_2$ and $Q_3$ are independently polyoxyalkylene containing 1 to 10 carbon atoms; $Q_5$ and $Q_6$ are independently alkyl of 1 to 3 carbon atoms or H, and n is at least one.

Particularly preferred herein is a urethane diacrylate which is the reaction product of toluene diisocyanate with a polyol with the end isocyanate groups end-capped with hydroxyethyl acrylate.

The acrylated urethane may also include diacrylates and triacrylates which are carboxylated to provide acid numbers ranging from 1 to 50 or more and molecular weights ranging from 500 to 5000. Carboxylated urethane diacrylates and triacrylates are particularly advantageous since they provide cleaner development in aqueous basic developer.

Suitable comonomers which can be used in combination with the acrylated urethane include the following: 1,5-pentanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylol-propane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S.

Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, triethylene glycol dimethacrylate, trimethylol propane triacrylate, ethylene glycol dimethacrylate, butylene glycol dimethacrylate, 1,3-propanediol dimethacrylate, 1,2,4- butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, 1,4- benzenediol dimethacrylate, and 1,3,5-triisopropenyl benzene and polycaprolactone diacrylate. Excessive amounts of trifunctional acrylate monomers can result in reduction of required flexibility.

A particularly preferred class of comonomers is hydroxy $C_1$–$C_{10}$-alkyl acrylate, hexamethylene glycol diacrylate, triethylene glycol diacrylate, tripropylene glycol diacrylate, pentaerythritol triacrylate, trimethylolpropane triacrylate, polyoxyethylated trimethylolpropane triacrylate, di-(3-acryloxy-2-hydroxypropyl) ether of bisphenol-A, di-(3-acryloxy-2-hydroxypropyl) ether of tetrabromo-bisphenol-A, or methacrylate analogues thereof.

(c) Photoinitiator System

The photoinitiator system contains one or more initiator compounds that directly furnish free-radicals when activated by actinic radiation. The system also may contain a sensitizer that is activated by the actinic radiation, causing the initiator compound to furnish the free-radicals. The sensitizer may extend spectral response into the near ultraviolet, visible, and near infrared spectral regions.

Numerous conventional photoinitiator systems are known to those skilled in the art and may be used herein provided they are compatible with the other ingredients of the coating composition. A large number of free-radical generating compounds, including redox systems such as Rose Bengal/2- dibutylaminothanol, may be selected to advantage. A useful discussion of dye sensitized photopolymerization can be found in "Dye Sensitized Photo-polymerization" by D. F. Eaton in *Adv. in Photochemistry*, Vol. 13, D. H. Volman, G. S. Hammond, and K. Gollinick, eds., Wiley-Interscience, New York, 1986, pp. 427–487.

Sensitizers useful with photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. A preferred group of sensitizers include the bis(p-dialkylaminobenzylidene) ketones disclosed in Baum et al, U.S. Pat. No. 3,652,275, and the arylidene aryl ketones disclosed in Dueber, U.S. Pat. No. 4,162,162, which are incorporated herein by reference.

Preferred photoinitiator systems are 2,4,5-triphenylimidazolyl dimers in combination with chain transfer agents, or hydrogen donors, such as are disclosed in U.S. Pat. Nos. 3,479,185; 3,784,557; 4,311,783; and 4,622,286 which are incorporated herein by reference. Preferred hexaarylbiimidazoles (HABI) are 2-o-chlorosubstituted hexaphenyl-biimidazoles in which the other positions on the phenyl radicals are unsubstituted or substituted with chloro, methyl or methoxy. The most preferred initiator is o-Cl-HABI, i.e., 1,1'-biimidazole, 2,2'-bis(o-chlorophenyl)-4,4', 5,5'-tetraphenyl-imidazole dimer.

Hydrogen donor compounds that function as chain transfer agents in the photopolymer compositions include: 2-mercaptobenzoxazole, 2-mercaptobenzo-thiazole, 4-methyl-4H- 1,2,4-triazole-3-thiol, etc.; as well as various types of compounds, e.g., (a) ethers, (b) esters, (c) alcohols, (d) compounds containing allylic or benzylic hydrogen, (e) acetals, (f) aldehydes, and (g) amides disclosed in column 12, lines 18 to 58 of MacLachlan U.S. Pat. No. 3,390,996. Suitable hydrogen donor compounds for use in systems containing both biimidazole type initiator and N-vinyl carbazole are 5-chloro-2-mercaptobenzo-thiazole; 2-mercaptobenzothiazole; 1H-1,2,4-triazole-3-thiol; 6-ethoxy-2- mercaptobenzo-thiazole; 4-methyl-4H-1,2,4-triazole-3-thiol; 1- dodecanethiol; and mixture thereof.

A particularly preferred class of photoinitiators and photosensitizers are benzophenone, Michler's ketone, ethyl Michler's ketone, p-dialkylaminobenzaldehydes, p-dialkylaminobenzoate alkyl esters, polynuclear quinones, thioxanthones, hexaarylbiimidazoles, cyclohexadienones, benzoin, benzoin dialkyl ethers, or combinations thereof where alkyl contains 1 to 4 carbon atoms.

(d) Blocked Polyisocyanate Crosslinking Agent

The photopolymerizable compositions of the present invention are generally applied to a substrate by lamination or from solution. In these processes, the composition is heated, for example, during the lamination operation or during evaporation of the solvent after application from solution. Partial crosslinking can take place in the unexposed areas even before photostructuring, which results in impairment of image quality. Thus, a desirable property of the photopolymerizable composition is that it undergoes as little crosslinking as possible due to this heat treatment. On the other hand, it is also desirable that the composition be cured rapidly and at moderate temperatures after application and imagewise exposure in order to obtain high throughput and simultaneous savings of energy costs.

According to the present invention, a thermally activated crosslinking agent is used which crosslinks with the reactive functional groups, such as hydroxyl, carboxyl, amide and amine groups which are present in the copolymer binder components and other ingredients in the photoimageable coating composition. The presence of the proper crosslink imparts the capability to withstand molten solder temperature and improves chemical resistance or other mechanical or chemical properties required in the end-use product.

The preferred crosslinking agent used herein is a blocked polyisocyanate which has a cleavage temperature of at least 100° C., or a mixture of polyisocyanates of this type. In the context of this description, this is to be understood as meaning a blocked polyisocyanate in which at least half of the blocked isocyanate groups are deblocked at a temperature of at least 100° C. and are thereby available for reaction with the isocyanate-reactive functional groups of the other components of the photoimageable composition.

The polyisocyanate on which the blocked component is based may be any aliphatic, cycloaliphatic, aromatic or arylaliphatic compounds having at least two, preferably two to four, isocyanate groups and which may have further substituents which are inert to isocyanate groups, such as alkyl or alkoxy groups.

These include, for example, the following compounds: 2,4-diisocyanatotoluene, and technical grade mixtures thereof with 2,6-diisocyanatotoluene, 1,5-diisocyanatonaphthalene, 1,4-diisocyanatonaphthalene, 4,4'-diisocyanatodiphenylmethane and technical grade mixtures of various diisocyanatodiphenylmethanes (for example the 4,4'- and 2,4'-isomers), diisocyanato-m-xylylene, N,N'-di(4-methyl-3-isocyanatophenyl) urea, 1,6-diisocyanatohexane, 1,12-diisocyanatododecane, 3,3,5-trimethyl-1-isocyanatomethylcyclohexane(isophorone diisocyanate), trimethyl-1,6-diisocyanatohexane, 1-methyl-2,4-diisocyanatocyclohexane, trisisocyanato-triphenylmethane and 4,4'-diisocyanatodicyclo-hexylmethane.

The polyisocyanates may be blocked by various radicals. Examples of suitable blocking components are beta-dicarbonyl compounds, such as malonates, acetoacetates or 2,4-pentanedione, or hydroxamates, triazoles, imidazoles, tetrahydropyrimidines, lactams, oximes, ketoximes, low molecular weight alcohols, or phenols or thiophenols.

The blocked polyisocyanate may also be a urethanized, carbodiimidated, biuretized, or dimerized or trimerized polyisocyanate, a trimer containing an isocyanurate ring, a biscyclic urea compound, a polymeric isocyanate, a copolymer of two or more diisocyanates, or other forms of polyisocyanates which are inactive below 100° C., so long as their cleavage temperature is at least 100° C. Examples of these are urethanized 4,4'-diisocyanato-diphenylmethane, carbodiimidated 4,4'-diisocyanatodiphenylmethane, uretdione of 2,4-diisocyanatotoluene, the trimer of diisocyanatotoluene, N,N',N"-tri(6-isocyanatohexyl)-biuret, isophorone diisocyanate, trimeric hexane diisocyanates, trimeric dodecane diisocyanates, adipoyl bis(propylene urea), and azelaoyl bis(propylene urea).

Preferred blocked polyisocyanates have a cleavage temperature between 100° C. to 200° C. Particularly preferred herein are methylethyl ketoxime blocked 1,6-diisocyanatohexane trimers and methylethyl ketoxime blocked isophorone diisocyanate.

Compared with photopolymerizable compositions cured using melamine-formaldehyde crosslinking agents, the photopolymerizable coating compositions of the invention are distinguished, surprisingly, by higher elongation and better chemical resistance at lower cure temperature. In addition, the cured coatings maintain their flexibility after cure, whereas coatings using melamine-formaldehyde crosslinking agents require a 20° C. higher cure temperature to obtain the same flex stability after cure, and sometimes lose some of this flexibility while aging under cool and/or dry conditions. To maintain stability of the laminate material, the cure temperature should be as low as possible above 100° C., since flexible circuits undergo more distortion at higher cure temperatures.

Fillers

The aqueous processable, photopolymerizable permanent coating compositions of this invention may optionally contain a preformed macromolecular elastomeric component as an organic filler. This elastomeric component typically is present as a separate micro-phase in the aqueous processable permanent coating composition, and as such is believed to be functioning as an elastomeric filler for the composition. Typically, such organic components contain substantially no acidic groups and consequently are insoluble in aqueous, alkaline developer solutions. However, dispersibility in the permanent coating composition and aqueous, alkaline developer solutions may be improved by incorporating sufficient carboxylic acid groups into the organic filler component if improvement in such development is required.

Although many elastomers may be used in the permanent coating composition, poly(methyl methacrylate-co-butadiene-co-styrene) is preferred. Other organic fillers which may be used include synthetic flexible polymers and rubbers, e.g., butadiene-co-acrylonitrile, acrylonitrile-co-butadiene-co-styrene, methacrylate-co- acrylonitrile-co-butadiene-co-styrene copolymers, and styrene-co-butadiene-co-styrene, styrene-co-isoprene-co-styrene block copolymers; saturated polyurethanes; poly (methylmethacrylate-co-butylacrylate); and the like. Further examples of organic filler components include conventional elastomers as defined on page 232 of "Hackh's Chemical Dictionary" Fourth Edition, Edited by J. Grant, McGraw-Hill Book Company, 1972.

The permanent coating compositions may also contain other organic fillers or inorganic particulates to modify the mechanical or chemical properties required during processing or end use. Suitable fillers include organic or inorganic reinforcing agents which are essentially transparent as disclosed in U.S. Pat. No. 2,760,863, e.g., organophilic silica bentonite, silica, and powdered glass having a particle size less than 0.4 micrometer; inorganic thixotropic materials as disclosed in U.S. Pat. No. 3,525,615 such as boehmite alumina, clay mixtures of highly thixotropic silicate oxide such as bentonite and finely divided thixotropic gel containing 99.5% silica with 0.5% mixed metallic oxide; microcrystalline thickeners as disclosed in U.S. Pat. No. 3,754,920 such as microcrystalline cellulose and microcrystalline silicas, clays, alumina, bentonite, kalonites, attapultites, and montmorillonites; finely divided powders having a particle size of 0.5 to 10 micrometers as disclosed in U.S. Pat. No. 3,891,441 such as silicon oxide, zinc oxide, and other commercially available pigments; and the binder-associated, transparent, inorganic particles as disclosed in European Patent Application 87113013.4 such as magnesium silicate (talc), aluminum silicate (clay), calcium carbonate and alumina. Typically, the filler is transparent to actinic radiation to preclude adverse effects during imaging exposure. Depending on its function in the photopolymerizable composition, the filler may be colloidal or have an average particle size of 0.5 micrometers or more in diameter.

Adhesion Promotor

The permanent coating composition may also contain a heterocyclic or mercaptan compound to improve adhesion of the coating to the metal circuit pattern during processing or in the end-use product. Suitable adhesion promotors include heterocyclics such as those disclosed in Hurley et al, U.S. Pat. No. 3,622,334, Jones, U.S. Pat. No. 3,645,772, and Weed, U.S. Pat. No. 4,710,262, which are incorporated herein by reference. Preferred adhesion promoters include benzotriazole, 5-chloro-benzotriazole, 1-chloro-benzotriazole, 1-carboxy-benzotriazole, 1-hydroxy-benzotriazole, 2-mercapto benzoxazole, 1H-1,2,4-triazole-3-thiol, 5-amino-1,3,4-thiadiazole-2-thiol, and mercaptobenzimidazole.

Other Components

Other compounds conventionally added to photopolymer compositions may also be present in the permanent coating to modify the physical properties of the film. Such components include: thermal stabilizers, colorants such as dyes and pigments, coating aids, wetting agents, release agents, and the like.

Thermal polymerization inhibitors that can be used in the permanent coating compositions are: Irganox® 1010, p-methoxyphenol, hydroquinone, and alkyl and aryl-substituted hyaroquinones and quinones, tert-butyl catechol, pyrogallol, copper resinate, naphthylamines, beta-naphthol, cuprous chloride, 2,6-di-tert-butyl-p-cresol cresol, phenothiazine, p-toluquinone and chloranil. Also useful as thermal polymerization inhibitors are the nitroso compounds disclosed in U.S. 4,168,982.

Various dyes and pigments may be added to increase the visibility of the resist image. Any colorant used, however, should preferably be transparent to the actinic radiation used.

On the basis of the essential ingredients (a) a cobinder system containing a low molecular weight copolymer component having acid functionality and a high molecular weight carboxylic acid-containing copolymer; (b) acrylated urethane; (c) photoinitiator system; and (d) blocked polyisocyanate crosslinking agent, a suitable concentration is component (a) 20 to 80 parts by weight, component (b) 10 to 40 parts by weight, component (c) 0.5 to 10 parts by weight, and component (d) 5 to 25 parts by weight.

Permanent Coating Applications

The permanent coatings of the invention can be used as a solder mask to protect printed circuits during subsequent processing, primarily solder operations, and/or from environmental effects during use. Permanent coatings also are used as intermediate insulative layers, with or without development, in the manufacture of multilayer printed circuits.

In practice, a photopolymerizable, permanent coating layer, typically between 10 and 125 micrometers (0.4 and 5 mils) thick, is applied to a printed circuit substrate which typically is a printed circuit relief pattern on a substrate that is semi-rigid, such as fiberglass reinforced epoxy, or on a flexible film substrate based on polyimide or polyester film. The applied photopolymerizable, permanent coating layer is then imagewise exposed to actinic radiation to harden or insolubilize exposed areas. Any unexposed areas are then completely removed typically with an alkaline, aqueous sodium or potassium carbonate developer solution which selectively dissolves, strips or otherwise disperses the unexposed areas without adversely affecting the integrity or adhesion of the exposed areas. The developed permanent resist image is first treated to further cure or harden it by baking at elevated temperatures, such as one hour at 150° C., by additional uniform exposure to actinic radiation or a combination thereof to produce a circuit board having a cured permanent resist layer covering all areas except unexposed areas that have been removed by development. Electrical components are then inserted into the through-holes or positioned on surface mount areas and soldered in place to form the packaged electrical component.

The photopolymerizable permanent coating may be applied to a printed circuit substrate either as a liquid, as a pre-formed dry film, or as a combination of a liquid and dry film.

Coating Liquids

The photopolymerizable, permanent resist may be coated as a liquid onto the printed circuit substrate using any conventional coating process. The liquid may be a solution or a dispersion of the permanent coating composition wherein the solvent is removed subsequent to coating to form a dry, solid, coverlay layer which, subsequent to coating, is directly imaged or exposed to actinic radiation to form a hardened coverlay layer. The liquids may be roller-coated, spin-coated, screen-coated or printed as disclosed in Coombs supra, in DeForest supra, in Lipson et al., U.S. Pat. No. 4,064,287, or in Oddi et al., U.S. Pat. No. 4,376,815. The liquid, typically as a solution, may also be curtain coated as disclosed in Losert et al., U.S. Pat. No. 4,230,793. In the instance where printed circuits are manufactured on a continuous web of film substrate, permanent coating liquid may be coated by any conventional web coating process.

Dry Film Lamination

A pre-formed, dry-film, photopolymerizable permanent coating layer is applied from a multi-ply, transfer, coverlay element using the lamination process as described in Celeste, U.S. Pat. No. 3,469,982. The multi-ply, permanent coating element comprises, in order, an actinic-radiation transparent, temporary support film, e.g., polyethylene terephthalate or silicon treated polyethylene terephthalate, a thin photo-polymerizable, permanent coating layer, and optionally a removable cover sheet, e.g., polyethylene or polypropylene, to protect the permanent coating element during storage. The photopolymerizable, permanent coating layer, is present in a range of thickness from 10 to 125 microns (0.4 to 5 mils) when used over printed circuit substrates. As described in Celeste supra, the cover sheet, if present, is first removed and the uncovered permanent coating surface is laminated to the pre-cleaned copper printed circuit surface of the substrate using heat and/or pressure, e.g., with a conventional hot-roll laminator. Although the laminate is typically imagewise exposed to actinic radiation through the temporary support film, in some instances, the temporary support may be removed before imaging to improve resolution and other such properties. In some instances permanent coating adhesion to the substrate can be improved by treating the substrate surface with a liquid at or just prior to lamination. The liquid may be insensitive to actinic radiation and may be a solution of adhesion promotors as disclosed in Jones, U.S. Pat. No. 3,645,772, a solvent or swelling agent for the coverlay layer such as disclosed in Fickes, U.S. Pat. No. 4,069,076, a non-solvent, such as disclosed in Cohen, U.S. Pat. No. 4,405,394 and European Patent 0041639, Pilette et al., U.S. Pat. No. 4,378,264, and Weiner et al., European Patent 0040842, or a liquid component of the permanent coating layer such as disclosed in Lau et al., U.S. Pat. No. 4,698,294. The liquid in some instances may be photosensitive. Typically, when a dry film is laminated to a printed circuit substrate having a low circuit relief, measures must be taken to eliminate entrapped air, e.g., from around circuit lines. Entrapped air is eliminated by the vacuum lamination process of Friel U.S. Pat. No. 4,127,436, by the grooved roll lamination process of Collier et al., U.S. Pat. No. 4,071,367, or by using liquid treating agents as described in Fickes supra and Lau et al supra.

Permanent Coating Evaluation

Printed circuits must withstand a variety of tests that are dependent on the application of the circuits, which in turn governs the type of material used as the circuit substrate. A stringent application is for flexible printed circuits which require a fold or bend for a particular space requirement, such as a camera or video cassette recorder (VCR), and may require the capability of surviving multiple bends, such as in a computer disc drive. In some applications a flexible circuit is combined with a rigid circuit to form a flex-rigid multilayer printed circuit. The end use tests for flexible circuits focus on adhesion and the capability to withstand single or multiple bends. In addition, accelerated aging is a useful test to simulate the practical concern of film aging on standing at ambient conditions for an extended period of time. The accelerated aging by exposure of the film to heat and humidity is effective for identifying film components that may oxidize or otherwise degrade more quickly than others. The tests that are used to support the Examples in this application are described herein.

Time To Clear

This test evaluates the retention time for adequately developing coverlay. Coverlay is laminated onto a rigid substrate, then timed when placed through a 1% sodium carbonate or potassium carbonate developer solution (which should be at the same temperature as that used in actual processing, typically 40° C.). The total "time to clear" is reported in seconds, beginning from the time the sample enters the developer and ending at the time at which all of the unexposed coverlay is washed off of the substrate.

Photo Speed

This test evaluates the processability of coverlay. Green coverlay is laminated onto a substrate, then is exposed to 500 mj/cm$^2$ UV through a 21-step Stouffer sensitivity photopattern. After the sample is developed, the resulting step-wedge pattern is analyzed. Values are reported in a X–Y range, in which the X value is the last step in which no developer attack is noted and Y is the last step containing coverlay. The optimum exposure level is obtained at a y value of 10 to 12. High x values indicate low attack of the photopolymer by the developer.

Encapsulation

This test evaluates the capability of coverlay to adequately protect the substrate. The substrate and coverlay chosen for this test should represent those in end-use applications. The substrate is typically a circuit pattern and is processed with the coverlay exactly as is done in actual manufacturing. After processing, the sample is evaluated using 10× magnification for any haloing and/or delaminations, which constitute a failure. In addition, the sample is cross-sectioned along the edge of a circuit line and evaluated using magnification to ensure that coverlay adequately covers the area with no "soda-strawing" defects. Before samples are processed further they should pass this encapsulation test. All of the examples of the invention passed the encapsulation test.

Cross-Hatch Adhesion

This test is performed according to ASTM D-3359-79, Method B. Test substrates are selected to duplicate the material typically used for end-use, and are processed to mirror actual processing.

Test substrates are either chemically cleaned substrates or substrates used without any pre-cleaning or etching of the copper surface. The samples that are chemically cleaned are cleaned in a series of steps with immersion first in Versa Clean® 415 for 2 minutes at 45° to 50° C. followed by immersion for 30 seconds in a deionized water bath. The samples are then immersed in Sure Etch® 550 micro etching solution for one minute at 35° C., followed by a deionized water rinse for 30 seconds. The samples are finally immersed in 10% sulfuric acid solution at room temperature for 30 seconds and given a final deionized water rinse. Samples are dried and placed immediately in a nitrogen atmosphere until used.

The test areas are a blank copper area and a blank adhesive area. Specimens are tested "after cure" as well as "after solder" exposure, which simulates solder exposure during PCB fabrication. Typical "after solder" specimens are floated in 288° C. 60/40 tin/lead solder for 30 seconds. Residual solder is then removed before evaluation. All specimens are scored with a 10 blade Gardco blade, then the sample is rotated 90° and rescored so that a cross-hatch pattern comprised of 100 squares is cut into the coverlay surface. Adhesive tape is applied and rubbed to ensure good contact, then pulled away at a 90° angle in a smooth fluid motion. The sample is examined using 10× magnification for defects, typically delamination or microcracks. Pick off from the cutting blade of 1–2% is not considered a failure but >2% pickoff is a failed sample.

Bend & Crease

The substrate to be used for this test is typically a MIT flexural endurance pattern. The MIT pattern is a meander pattern that has alternating one mm lines and spaces in the region of the testing. The sample is creased perpendicular to the direction of the lines and spaces. The substrate is typically the same type as that used in the actual product application. The thickness and type of substrate (copper, adhesive) and the processing steps (pre-clean, lamination, cure, solder exposure) are duplicated so that the evaluation reflects a true simulation. Typically a TecLam__ LF9111 substrate is used with copper etched off of one side. A Riston® photoresist is applied to one side of the double side clad and the copper is etched off of the other side using ammoniacal cuprous chloride solution at 58° C. The Riston® film is then exposed to the MIT pattern, unexposed photoresist is developed away in 1% sodium carbonate solution and the exposed resist is stripped in potassium hydroxide solution to reveal the copper meander pattern. Samples are bent and creased by hand 90° perpendicular to the lines and spaces in 10 different areas of each sample, then examined using 10× magnification for defects such as cracks or delaminations. Any reported defects constitute a failure. Samples are evaluated "after cure" and "after solder", in which case samples are floated, coverlay side up, in 288° C. 60/40 tin/lead solder for 30 seconds, then cooled to room temperature and evaluated as described above.

Chemical Resistance

This test is designed to analyze any degradation in film properties when exposed to chemicals in the photoimaging processing steps. Coverlay is processed on a circuit-patterned substrate (circuitry and substrate used should be of the same type as that found in actual use). Each sample is immersed for up to 15 minutes in a chemical typically used in processing. These chemicals include plating chemicals such as 10% NaOH, 10% HCl, 10% $H_2SO_4$ and cleaning solvents such as methyl ethyl ketone (MEK), trichloroethylene (TCE) and isopropanol (IPA). After immersion, each sample is examined using 10× magnification for defects such as delamination, wicking, embrittlement or solvent attack. Any defects found are reported as failures.

Gold Plating Testing

This test is designed to determine the resistance of the cured film to gold plating. Samples are placed for 3 minutes in 5% Metex® cleaner, followed by a 10 μ-in. etch in 25% Preposit® 746. The etched samples are plated in Copper Gleem® (PCM+) to 1 mil thickness at 30 amps/square foot for 36 minutes, plated to 0.2 mil thickness in nickel sulfamate at 30 amps/square foot for 8 minutes, and plated to 0.04 mil (1 micron) thickness in gold potassium cyanide at 5 amps/square foot for 8 minutes. After gold plating the samples are examined for the effect of residue on the copper before gold plating which reduces the smoothness and uniformity of the gold surface. In addition, adhesive tape is placed over the plated gold circuit traces and quickly pulled away to assess adhesion. Adhesive tape is also placed over the coverlay and pulled in the same way to assess adhesion after gold plating. Samples pass when less than 1% of gold or coverlay is removed.

Elongation to Break

The coating is laminated on Teflon® sheet, exposed at 500 mj/sq cm, developed at 40° C. for two times the time to develop non-imaged material, air dried and cured for one hour at 170° C. The samples are cut into one-half inch wide strips with a JDC precision Sample Cutter (Thwing-Albert Instrument Co.). Samples tested as unconditioned material are placed into a zip-lock bag until testing. Samples that are conditioned are placed in a nitrogen-purged 100° C. oven, the temperature is held for one hour, and then the samples are allowed to slowly cool to room temperature over a three hour period. The samples are placed in a desiccator with dry magnesium sulfate, and held in this dry condition until tested on an Instron tester according to ASTM D-882-83 (Method A). The percent elongation is computed from the stress-strain data using instron software Series IX Automated Materials Testing System 1.02C.

EXAMPLES

To further illustrate the invention, the examples below are provided. Materials used for the examples are:

| Co-Binders | |
|---|---|
| A. High MW copolymers | |
| Carboset ® 525 | Acrylic acid-containing copolymer from B. F. Goodrich, Cleveland, OH. The $T_g$ is 37° C., the molecular weight is 200M and the acid number is 80 |
| Carboset ® 526 | Acrylic acid-containing copolymer from B. F. Goodrich, Cleveland, OH. The $T_g$ is 70° C., the molecular weight is 180M and the acid number is 100 |
| Acrylic polymer #1 | Copolymer of methyl methacrylate, ethyl acrylate and acrylic acid (61.7/25.7/12.6) having a $T_g$ of 80.8° C., molecular weight ($M_w$) of 171M and acid number of 91.0 |
| Acrylic polymer #2 | Copolymer of methyl methacrylate, ethyl acrylate and acrylic acid (32/58/10) having a $T_g$ of 35.4° C., molecular weight ($M_w$) of 168M and acid number of 71.8 |
| Acrylic polymer #3 | Copolymer of methyl methacrylate, ethyl acrylate and acrylic acid (32/56.7/11.3) having a $T_g$ of 34.9° C., molecular weight ($M_w$) of 226M and acid number of 84.6 |
| Acrylic polymer #4 | Copolymer of methyl methacrylate, ethyl acrylate and acrylic acid (32/55.4/12.6) having a $T_g$ of 37.3° C., molecular weight ($M_w$) of 191M and acid number of 90.4 |
| Acrylic polymer #5 | Copolymer of methyl methacrylate, ethyl acrylate and acrylic acid (46.8/41.9/11.3) having a $T_g$ of 55.0° C., molecular weight ($M_w$) of 179M and acid number of 81.5 |
| B. Low MW polymers | |
| Carboset ® 515 | Acrylic acid containing copolymer having a $T_g$ of −14° C., a molecular weight of 7000 and an acid number of 63 from B. F. Goodrich, Cleveland, OH |
| Low MW copolymer #1 | Copolymer of ethyl acrylate and acrylic acid (83/17) having a $T_g$ of 2.3° C., a molecular weight ($M_w$) of 6400, and an acid number of 117 |
| Low MW copolymer #2 | Copolymer of ethyl acrylate and acrylic acid (87/13) having a $T_g$ of −0.8° C., a molecular weight ($M_w$) of 6500, and an acid number of 102 |
| Low MW copolymer #3 | Copolymer of ethyl acrylate, acrylic acid and methyl methacrylate (73/17/10) having a $T_g$ of 12.4° C., a molecular weight ($M_w$) of 8600, and an acid number of 114 |
| Monomers | |
| Ebecryl ® 3704 | Diacrylate of bisphenol-A-diglycidyl ether from UBC Chemicals, Smyrna, GA. |
| Ebecryl ® 6700 | Urethane diacrylate from UBC Chemicals, Smyrna, GA. |
| Purelast ® 153 | Urethane diacrylate from Polymer Systems Corp,. Orlando, FL. |
| Purelast ® 159 | Carboxylated urethane diacrylate from Polymer Systems Corp., Orlando, FL. |
| Thermal Crosslinking Agents | |
| Blocked isocyanate #1 | Hexamethylene diisocyanate based polyisocyanate blocked with methyl ethyl ketoxime and dissolved at 75% solids in propylene glycol methyl ether acetate |
| Blocked isocyanate #2 | Hexamethylene diisocyanate based polyisocyanate blocked with methyl ethyl ketoxime and dissolved at 75% solids in ethyl acetate |
| Initiators | |
| o-Cl HABI | Hexaarylbiimidazole |
| EMK | Ethyl Michler's Ketone |
| Detackifiers | |
| PVP K-120 | Polyvinylpyrrolidine from GAF Chemicals Corp., Texas City, TX. |
| Other Ingredients | |
| Irganox ® 1010 | Antioxidant from Ciba Geigy Corp., Ardsley, NY |
| DayGlo ® HMO15A19 | Green dye from Dayglo Corp., Cleveland, OH. |
| DayGlo ® 122-10321 | Blue dye from Dayglo Corp., Cleveland, OH. |

| | |
|---|---|
| Cobratec® CBT | A 50/50 mixture of 4 & 5 substituted isomers of carboxybenzotriazole from Specialties Group Inc., Cincinnati, OH. |
| 3MT | 3-mercapto-1H-1,2,4-triazole from Esprit Chemical Co., Rockland, MA. |
| 5-ATT | 5-amino-1,3,4-thiadiazole-2-thiol |
| Cyprubond® Talc | 1726 talc filler from Whittaker, Clark and Daniels, Inc., Plainfield, NJ |
| Claytone® APA | Alkyl quaternary ammonium montmorillonite from Southern Clay Products, Inc., Gonzales, TX |

The talc dispersion used in Example 14 was prepared by premixing 95 g Cyprubond® Talc with a solution of 5 g Carboset® 515, 150 g ethyl acetate and 100 g methanol, and adding this to an attritor containing 900 g of 1.2 mm diameter ceramic media. The dispersion was milled for 45 min, and the dispersion was collected by pouring through a screen. The ceramic media was rinsed with 200 g of 60/40 ethyl acetate/methanol. The % solids was measured as 18.2%.

The clay filler dispersion used in Example 15 was prepared by slurrying 40 g Claytone® APA clay filler in 625 g of 60/40 ethyl acetate/methanol plus 5 g of Carboset® 515. Aliquots (195 g) of this slurry were milled for 30 min and 86 g of 60/40 ethyl acetate/methanol was added to assist filtration through a screen. The % solids was measured as 8.4%.

The liquid photoimageable compositions were converted to dry films using a machine coater such as a Pilot Coater or an extrusion die coater. For films coated on a Pilot Coater, liquid compositions were either extrusion-die coated or were coated using a 10 mil doctor knife on a substrate to give approximately 2 mil thick dried films. A three-zone dryer with each zone 15 feet in length and with dryer temperatures of 50° C., 98° C., and 115° C. and a line speed of 20 feet per minute was typically used. The preferred coating substrate was a 0.92 mil Mylar® polyester film. A removable, 1 mil thick polyethylene coversheet was used to protect the coated substrate during storage.

Examples 1 to 4

Examples 1 to 4 illustrate the properties of coating compositions containing different low MW copolymer binder components having different molecular weights and acid numbers.

| | Example 1 (% by weight) | Example 2 (% by weight) | Example 3 (% by weight) | Example 4 (% by weight) |
|---|---|---|---|---|
| Component | | | | |
| Methanol | 22.79 | 22.79 | 22.79 | 22.77 |
| Ethyl acetate | 30.78 | 30.78 | 30.78 | 30.78 |
| Ebecryl® 6700 75% in ethyl acetate | 11.22 | 11.22 | 11.22 | 11.22 |
| Ebecryl® 3704 75% in ethyl acetate | 9.41 | 9.41 | 9.41 | 9.40 |
| 5-ATT | 0.07 | 0.07 | 0.07 | 0.06 |
| o-Cl HABI | 0.20 | 0.20 | 0.20 | 0.20 |
| Benzophenone | 1.13 | 1.13 | 1.13 | 1.13 |
| EMK | 0.05 | 0.05 | 0.05 | 0.06 |
| Irganox® 1010 | 0.20 | 0.20 | 0.20 | 0.20 |
| PVP K-120 | 1.20 | 1.20 | 1.20 | 1.19 |
| Blocked isocyanate #1 | 4.80 | 4.80 | 4.80 | 4.80 |
| Carboset® 525 | 14.95 | 14.95 | 14.95 | 14.96 |
| DayGlo® 122-10321 | 1.20 | 1.20 | 1.20 | 1.19 |
| Carboset® 515 | 2.01 | 0 | 0 | |
| Low MW copolymer #1 | 0 | 2.01 | 0 | |
| Low MW copolymer #2 | 0 | 0 | 2.01 | |
| Low MW copolymer #3 | | | | 2.00 |
| Property | | | | |
| Thickness (micrometers) | 50 | 50 | 50 | 50 |
| Time-to-clear (sec) | 39 | 41 | 39 | 42 |
| Stepwedge response | 4–10 | 4–10 | 4–10 | 4–10 |
| Cure conditions | 170° C./1 hr | 170° C./1 hr | 170° C./1 hr | 170° C./1 hr |
| Bend & Crease | | | | |
| Substrate: TecLam__LF9111[1] with copper etched off one side and a MIT pattern on the other side of the laminate | | | | |
| After cure | Pass | Pass | Pass | Pass |
| After solder | Pass | Pass | Pass | Pass |
| Cross-Hatch Adhesion | | | | |
| Substrate: TecLam__LF9111[1] that was chemically cleaned | | | | |
| After cure | Pass | Pass | Pass | Pass |
| After solder | Pass | Pass | Pass | Pass |
| % Elongation to Break | | | | |
| Conditioned | 85 | 88 | 73 | 57 |

[1] Teclam™ LF 9111 is a laminate material of 1 mil Kapton® polyimide film coated on one side with 1 mil of epoxy-based adhesive and cured with 1 oz/ft2 of copper foil laminated to the adhesive side, available from E. I. duPont de Nemours & Co.

Examples 5 to 10

Examples 5 to 10 illustrate the properties of coating compositions containing different high MW copolymer binders having different $T_g$ and acid numbers.

| | Example 5 (% by weight) | Example 6 (% by weight) | Example 7 (% by weight) | Example 8 (% by weight) | Example 9 (% by weight) | Example 10 (% by weight) |
|---|---|---|---|---|---|---|
| Component | | | | | | |
| Methanol | 19.99 | 19.99 | 19.99 | 19.99 | 19.99 | 19.99 |
| Ethyl acetate | 29.93 | 29.93 | 29.93 | 29.93 | 29.93 | 29.93 |
| Blocked isocyanate #2 | 6.87 | 6.87 | 6.87 | 6.87 | 6.87 | 6.87 |
| Ebecryl® 6700 75% in ethyl acetate | 11.99 | 11.99 | 11.99 | 11.99 | 11.99 | 11.99 |
| Ebecryl® 3704 | 10.05 | 10.05 | 10.05 | 10.05 | 10.05 | 10.05 |

-continued

|  | Example 5 (% by weight) | Example 6 (% by weight) | Example 7 (% by weight) | Example 8 (% by weight) | Example 9 (% by weight) | Example 10 (% by weight) |
|---|---|---|---|---|---|---|
| 75% in ethyl acetate |  |  |  |  |  |  |
| Carboset ® 515 | 2.14 | 2.14 | 2.14 | 2.14 | 2.14 | 2.14 |
| 3-MT | 0.09 | 0.09 | 0.09 | 0.09 | 0.09 | 0.09 |
| o-Cl HABI | 0.20 | 0.20 | 0.20 | 0.20 | 0.20 | 0.20 |
| EMK | 0.05 | 0.05 | 0.05 | 0.05 | 0.05 | 0.05 |
| Irganox ® 1010 | 0.20 | 0.20 | 0.20 | 0.20 | 0.20 | 0.20 |
| Benzophenone | 1.21 | 1.21 | 1.21 | 1.21 | 1.21 | 1.21 |
| DayGlo ® HMO15A19 | 1.30 | 1.30 | 1.30 | 1.30 | 1.30 | 1.30 |
| PVP K-120 | 1.30 | 1.30 | 1.30 | 1.30 | 1.30 | 1.30 |
| Carboset ® 525 | 14.69 | 0 | 0 |  |  |  |
| Acrylic polymer #1 | 0 | 14.69 | 0 |  |  |  |
| Acrylic polymer #2 | 0 | 0 | 14.69 |  |  |  |
| Acrylic polymer #3 |  |  |  | 14.69 | 0 | 0 |
| Acrylic polymer #4 |  |  |  | 0 | 14.69 | 0 |
| Acrylic polymer #5 |  |  |  | 0 | 0 | 14.69 |
| Property |  |  |  |  |  |  |
| Thickness (micrometers) | 50 | 50 | 50 | 50 | 50 | 50 |
| Time-to-clear (sec) | 32 | 150 | 29 | 47 | 39 | 92 |
| Stepwedge response | 5–11 | 2–8 | 5–11 | 4–11 | 4–11 | 3–9 |
| Cure conditions | 170° C./1 hr | 170° C./1 hr | 170° C./1 hr | 170° C./1 hr | 170° C./1 hr | 170° C./1 hr |
| Bend & Crease |  |  |  |  |  |  |
| Substrate: TecLam_LF9111[1] with copper etched off one side and a MIT pattern on the other side of the laminate |  |  |  |  |  |  |
| After cure | Pass | 9 of 10 Pass | Pass | 9 of 10 Pass | Pass | 9 of 10 Pass |
| After solder | Pass | 8 of 10 Pass | Pass | Pass | Pass | Pass |
| Cross-Hatch Adhesion |  |  |  |  |  |  |
| Substrate: TecLam_LF9111[1] that was chemically cleaned |  |  |  |  |  |  |
| After cure | Pass | Pass | Pass | Pass | Pass | Pass |
| After solder | Pass | Pass | Pass | Pass | Pass | Pass |
| % Elongation to Break |  |  |  |  |  |  |
| Conditioned | 60 | 27 | 59 | 69 | 51 | 39 |

Examples 11 to 13

Example 11 to 13 illustrate the properties of coating compositions containing carboxylated and non-carboxylated urethane diacrylates.

| Component | Example 11 (% by weight) | Example 12 (% by weight) | Example 13 (% by weight) |
|---|---|---|---|
| Methanol | 19.95 | 19.95 | 19.95 |
| Ethyl acetate | 32.81 | 32.81 | 30.23 |
| Blocked isocyanate #2 | 6.88 | 6.88 | 5.16 |
| Ebecryl ® 6700 75% in ethyl acetate | 0 | 0 | 12.04 |
| Ebecryl ® 3704 75% in ethyl acetate | 10.09 | 10.09 | 10.09 |
| Purelast ® 159 | 9.03 | 0 | 0 |
| Purelast ® 153 | 0 | 9.03 | 0 |
| Carboset ® 515 | 2.15 | 2.15 | 2.15 |
| 3-MT | 0.09 | 0.09 | 0.09 |
| o-Cl HABI | 0.21 | 0.21 | 0.21 |
| EMK | 0.04 | 0.04 | 0.04 |
| Irganox ® 1010 | 0.21 | 0.21 | 0.21 |
| Benzophenone | 1.20 | 1.20 | 1.20 |
| PVP K-120 | 1.29 | 1.29 | 1.29 |
| DayGlo ® HMO15A19 | 1.29 | 1.29 | 1.29 |
| Carboset ® 525 | 14.75 | 14.75 | 16.04 |
| Property |  |  |  |
| Thickness (micrometers) | 50 | 50 | 50 |
| Time-to-clear (sec) | 18 | 27 | 32 |
| Stepwedge response | 4–11 | 8–13 | 5–12 |
| Cure conditions | 170° C./1 hr | 170° C./1 hr | 170° C./1 hr |
| Bend & Crease |  |  |  |
| Substrate: TecLam_ LF9111[1] with copper etched off one side and a MIT pattern on the other side of the laminate |  |  |  |
| ○ After cure | 4 of 10 Pass | Pass | Pass |
| ○ After solder | Pass | Pass | Pass |
| Cross-Hatch Adhesion |  |  |  |
| Substrate: TecLam_ LF9111[1] that was chemically cleaned |  |  |  |
| ○ After cure | Pass | 1% | Pass |
| ○ After solder | Pass | Pass | Pass |
| % Elongation to Break |  |  |  |
| ○ Conditioned | 42 | 84 | 57 |
| Chemical Resistance |  |  |  |
| Substrate: TecLam_ LF9111[1] that was chemically cleaned |  |  |  |
| ○ Isopropanol | Pass | Pass | Pass |
| ○ 10% $H_2SO_4$ | Pass | Pass | Edge delamination, haloing |
| ○ 10% NaOH | Pass | Pass | Pass |

Examples 14 and 15

Examples 14 and 15 illustrate the use of talc and clay fillers to lower the tackiness of the coating compositions.

| Component | Example 14 | Example 15 |
|---|---|---|
| | (% by weight) | (% by weight) |
| Methanol | 15.88 | 18.08 |
| Ethyl acetate | 23.94 | 27.25 |
| Blocked isocyanate #1 | 4.10 | 4.66 |
| Ebecryl ® 6700 75% in ethyl acetate | 9.56 | 10.88 |
| Ebecryl ® 3704 75% in ethyl acetate | 8.01 | 9.12 |
| Carboset ® 515 | 1.71 | 1.94 |
| 3-MT | 0 | 0.08 |
| 5-ATT | 0.07 | 0 |
| o-Cl HABI | 0.17 | 0.20 |
| Benzophenone | 0.95 | 1.08 |
| EMK | 0.03 | 0.04 |
| Irganox ® 1010 | 0.17 | 0.20 |
| DayGlo ® HM015A19 | 1.02 | 1.17 |
| PVP K-120 | 1.02 | 1.17 |
| Carboset ® 525 | 12.73 | 14.49 |
| Cyprubond ® talc dispersion | 20.63 | 0 |
| Claytone ® APA dispersion | 0 | 9.65 |
| Property | | |
| Thickness (micrometers) | 50 | 50 |
| Time-to-clear (sec) | 29 | 32 |
| Stepwedge response | 5–11 | 7–12 |
| Cure conditions | 170° C./1 hr | 170° C./1 hr |
| Bend & Crease | | |
| Substrate: TecLam__ LF9111[1] with copper etched off one side and a MIT pattern on the other side of the laminate | | |
| ○ After cure | Pass | Pass |
| ○ After solder | Pass | Pass |
| Cross-Hatch Adhesion | | |
| Substrate: TecLam__ LF9111[1] that was chemically cleaned | | |
| ○ After cure | Pass | Pass |
| ○ After solder | Pass | Pass |
| % Elongation to Break | | |
| ○ Conditioned | 24 | 46 |
| Gold Plating | | |
| ○ Adhesion of gold | Pass | Pass |
| ○ Adhesion of coverlay | Pass | Pass |
| ○ Residue | None observed | None observed |

What is claimed is:

1. Coating composition which photopolymerizable coating composition which maintains flexibility after curing and is processable in aqueous alkaline developer solution providing a protective coating for printed circuits, which comprises:

(a) a cobinder system comprising at least one low molecular weight copolymer binder component having a weight average molecular weight of from 3,000 to 15,000 and containing from 2 to 50% by weight of at least one carboxylic acid containing structural unit and from 50 to 98% by weight of at least one structural unit of the formula

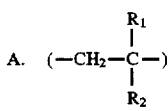

wherein $R_1$ is H, alkyl or aryl; $R_2$ is H, $CH_3$, aryl, —$COOR_3$, —$CONR_4R_5$ or —CN; and $R_3$, $R_4$ and $R_5$ independently are H, alkyl, aryl, or aryl substituted with one or more hydroxy, ester, keto, ether or thioether groups; and at least one high molecular weight carboxylic acid containing copolymer binder component having a weight average molecular weight of from 40,000 to 500,000 and containing structural units of the formula

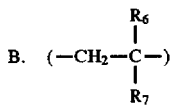

wherein $R_6$ is H, alkyl, —CN or aryl; $R_7$ is aryl, —$COOR_8$ or —$CONR_4R_5$; and $R_8$ is H or alkyl containing from 1 to 8 carbon atoms; wherein said low molecular weight and said high molecular weight binder components are present in admixture of differing constituents;

(b) an acrylated urethane monomeric component;

(c) a photoinitiator or a photoinitiator system; and (d) a blocked polyisocyanate crosslinking agent.

2. The photopolymerizable coating composition of claim 1 wherin the carboxylic acid-containing structural unit of the low molecular weight copolymer binder comprises the polymerized reaction product of an ethlenically unsaturated carboxylic acid.

3. The photopolymerizable coating composition of claim 2 wherein the ethylenically unsaturated carboxylic acid comprises acrylic acid, methacrylic acid, maleic acid, maleic acid half ester or anhydride, itaconic acid, itaconic half ester or anhydride, citraconic acid or citraconic acid half ester or anhydride.

4. The photopolymerizable coating composition of claim 3 wherein the ethylenically unsaturated carboxylic acid comprises acrylic acid or methacrylic acid.

5. The photopolymerizable coating composition of claim 1 wherein the carboxylic acid structural unit comprises from 5 to 25% by weight of the low molecular weight copolymer binder.

6. The photopolymerizable coating composition of claim 1 wherein the structural unit (A) of the low molecular weight copolymer binder comprises the polymerized reaction product of styrene and esters or amides of acrylic and methacrylic acid.

7. The photopolymerizable coating composition of claim 6 wherein structural unit (A) of the low molecular weight copolymer binder comprises the polymerized reaction product of methyl methacrylate, ethyl methacrylate, butyl methacrylate, methacrylamide, methyl acrylate, ethyl acrylate, butyl acrylate, hydroxyethyl acrylate, hydroxyethyl methacrylate, acrylamide, or styrene.

8. The photopolymerizable coating composition of claim 1 wherein the structural units (B) of the high molecular weight carboxylic acid-containing copolymer binder component comprise the polymerized reaction product of styrene, methacrylic acid, methyl methacrylate, ethyl methacrylate, butyl methacrylate, acrylic acid, methyl acrylate, ethyl acrylate, butyl acrylate, octylacrylamide, hydroxyethyl acrylate, hydroxyethyl methacrylate, hydroxypropyl methacrylate or t-butylaminoethyl methacrylate.

9. The photopolymerizable coating composition of claim 8 wherein the structural units (B) comprise the polymerized reaction product of methacrylic acid or acrylic acid.

10. The photopolymerizable coating composition of claim 1 wherein the high molecular weight carboxylic acid copolymer binder comprises a copolymer of methyl methacrylate, ethyl acrylate and methacrylic acid.

11. The photopolymerizable coating composition of claim 1 wherein the low molecular weight carboxylic acid copolymer binder comprises a copolymer of ethyl acrylate and acrylic acid.

12. The photopolymerizable coating composition of claim 1 wherein the high molecular weight carboxylic acid copolymer binder comprises a copolymer of styrene and maleic anhydride, acid, ester, half-ester or half-amide.

13. The photopolymerizable coating of claim 1 comprising from 2 to 50% by weight of the low molecular weight copolymer binder component and from 50 to 98% by weight of the high molecular weight carboxylic acid copolymer binder component, based on the total weight of the cobinder system.

14. The photopolymerizable coating of claim 13 comprising from 4 to 45% by weight of the low molecular weight copolymer binder component and from 55 to 96% by weight of the high molecular weight carboxylic acid copolymer binder component.

15. The photopolymerizable coating of claim 14 wherein the low molecular weight copolymer binder component has a molecular weight ranging from 4,000 to 10,000 and the high molecular weight copolymer binder component has a molecular weight ranging from 100,000 to 250,000.

16. The photopolymerizable coating of claim 15 wherein the ratio of the low molecular weight copolymer binder component to the high molecular weight copolymer binder component ranges from 0.05 to 0.55.

17. The photopolymerizable coating of claim 15 wherein the low molecular weight binder component comprises a copolymer of ethyl acrylate and acrylic acid and the high molecular weight binder component comprises a copolymer of methyl methacrylate, ethyl acrylate and acrylic acid.

18. The photopolymerizable coating composition of claim 1 wherein the acrylated urethane monomeric component has the structure:

22. The photopolymerizable coating composition of claim 1 wherein the acrylated urethane monomeric component is a urethane diacrylate or triacrylate containing carboxylic acid groups.

23. The photopolymerizable coating composition of claim 1 wherein the blocked polyisocyanate crosslinking agent comprises an aliphatic, cycloaliphatic, aromatic or arylaliphatic di, tri or tetraisocyanate whose isocyanate groups are blocked by betacarbonyl compounds, hydroxamates, triazoles, imidazoles, tetrahyropyrimidines, lactams, ketoximines, oximes, low molecular weight alcohols, phenols or thiophenols.

24. The photopolymerizable coating composition of claim 23 wherein the blocked polyisocyanate comprises the trimer of hexamethylene diisocyanate blocked with methylethyl ketoxime.

25. The photopolymerizable coating composition of claim 23 wherein the blocked polyisocyanate comprises isophorone diisocyanate blocked with methyl ethyl ketoxime.

26. A flexible printed circuit comprising:

(a) a flexible substrate;

(b) an electrically conductive circuit pattern on at least one side of the flexible substrate; and (c) an outermost layer of the coating composition of claim 1 applied over the electrically conductive circuit pattern.

27. A rigid printed circuit comprising:

(a) a rigid substrate;

(b) an electrically conductive circuit pattern on at least one side of the rigid substrate; and

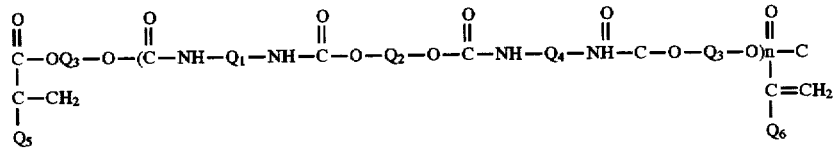

wherein n is at least one; $Q_1$ and $Q_4$ are aromatic groups which are unsubstituted or substituted by lower alkyl groups and which can contain a lower alkylene group as a connecting member; $Q_2$ and $Q_3$ are independently polyoxyalkylene containing 1 to 10 carbon atoms; and $Q_5$ and $Q_6$ are independently alkyl of 1 to 3 carbon atoms or H.

19. The photopolymerizable coating composition of claim 18 wherein the acrylated urethane monomeric component is a urethane diacrylate comprising the reaction product of toluene diisocyanate with a polyol and the end isocyanate groups end-capped with hydroxyethyl acrylate.

20. The photopolymerizable coating composition of claim 18 wherein the acrylated urethane monomeric component is a urethane triacrylate comprising the reaction product of toluene diisocyanate with a polyol and the end isocyanate groups end-capped with hydroxyethyl acrylate.

21. The photopolymerizable coating composition of claim 1 wherein the acrylated urethane monomeric component is a urethane diacrylate or triacrylate.

(c) an outermost layer of the coating composition of claim 1 applied over the electrically conductive circuit pattern.

28. A printed circuit comprising:

(a) both a flexible and a rigid substrate;

(b) an electrically conductive circuit pattern on at least one side of the flexible or rigid substrate; and (c) an outermost layer of the coating composition of claim 1 applied over the electrically conductive circuit pattern.

29. The printed circuit of claim 28 wherein the rigid substrate is adjacent to the outermost layer of the coating composition.

30. The printed circuit of claim 28 wherein the flexible substrate is adjacent to the outermost layer of the coating composition.

* * * * *